April 1, 1958 J. I. PANKOVE 2,829,075

FIELD CONTROLLED SEMICONDUCTOR DEVICES AND METHODS OF MAKING THEM

Filed Sept. 9, 1954

INVENTOR.
JACQUES I. PANKOVE
BY J. L. Whittaker
ATTORNEY

United States Patent Office 2,829,075

Patented Apr. 1, 1958

2,829,075

FIELD CONTROLLED SEMICONDUCTOR DEVICES AND METHODS OF MAKING THEM

Jacques I. Pankove, Princeton, N. J., assignor to Radio Corporation of America, a corporation of Delaware Application September 9, 1954, Serial No. 454,959

18 Claims. (Cl. 148—1.5)

Figure 1:
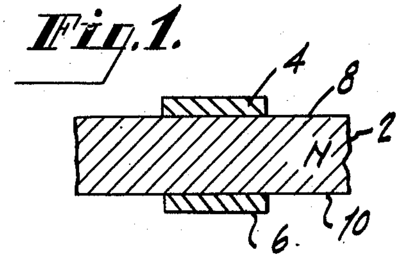

This invention relates to improved field controlled semiconductor devices and methods of making them. More particularly it relates to improved unipolar and tetrode transistor devices.

Field controlled transistor devices have been previously described. See, for example, an article by W. Shockley entitled "A unipolar 'field effect' transistor," page 1365 and an article by R. L. Wallace, Jr., et al. entitled "A junction transistor tetrode for high frequency use," page 1395, both in the Proceedings of the I. R. E., volume 40 (November 1952). These devices generally comprise bases of a semiconductive material such as germanium or silicon in the form of relatively thin wafers or filaments.

A typical unipolar transistor comprises a signal current path, or channel within a semi-conductor body and bounded by a p–n rectifying junction which may be subjected to a varying reverse direction potential to control the resistance of the channel. The signal current in a unipolar transistor is carried by majority charge carriers and the control potential operates to vary the density of the majority carriers within the current channel.

A tetrode transistor may be described as an ordinary triode transistor utilizing minority carrier conduction and with the added provision of means to apply an electric field in the base region in a direction perpendicular to the direction of signal current flow. The field serves to constrict the signal current to a relatively limited region of the base and thus to improve the high frequency characteristics of the device. The advantages and typical circuit utilizations of such devices are known and are discussed, for example, in the heretofore identified Wallace article.

The dimensions of field effect devices, i. e., the actual physical spacings between the different parts of the devices are relatively critical. For satisfactory operation at relatively high electrical frequencies in a unipolar transistor, for example, a control electrode must be placed extremely close to one of the signal current electrodes, preferably within a few ten-thousandths of an inch. Such relatively close spacings are relatively difficult to accomplish by previously known methods of construction and, therefore, previous devices are relatively limited in their high frequency applications.

One object of the instant invention is to provide improved field effect semiconductor devices.

Another object is to provide improved unipolar and tetrode transistor devices.

Another object is to provide improved field control semiconductor devices capable of operation at relatively high electrical frequencies.

A further object is to provide improved methods of making unipolar and tetrode transistor devices especially adapted for operation at relatively high electrical frequencies.

These and other objects are accomplished by the instant invention which provides improved field controlled devices having desirably small current paths. The devices comprise pairs of coaxially aligned, barrier-forming electrodes fused to opposite surfaces of substantially flat semiconductor wafers. The wafers each include at least two regions of mutually different conductivity characteristics, one of which regions is disposed entirely directly between the barrier-forming electrodes. A typical device according to the invention may be made by first surface alloying a pair of electrodes to opposite faces of a semiconductor wafer. All portions of the wafer except a region directly between the electrodes are then converted to a different conductivity characteristic to provide an electrical barrier between the major part of the wafer and the region between the electrodes. The conversion may be carried out by diffusing a selected impurity having a high diffusion coefficient into the wafer.

Figure 2:
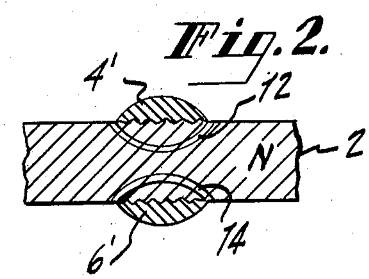
Figure 3:
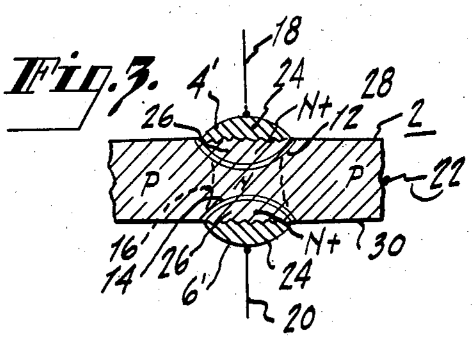
Figure 4:
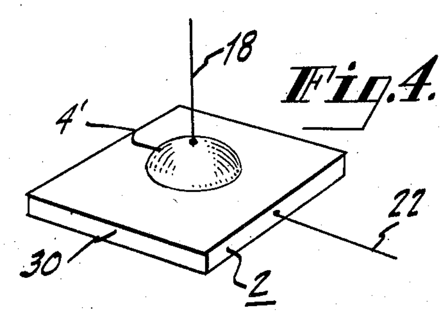
Figure 5:
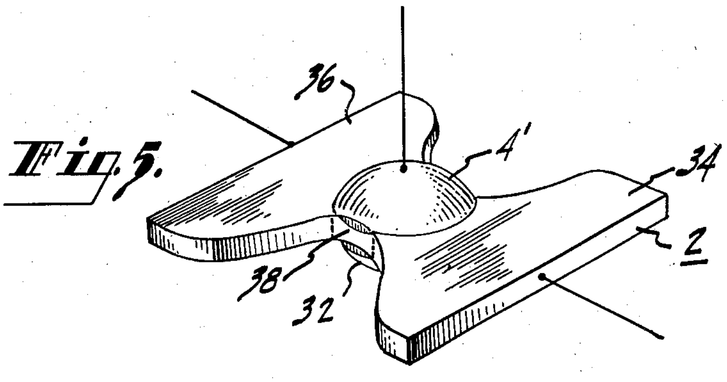

The invention will be described in greater detail in connection with the accompanying drawing of which Figures 1–3 are schematic, cross-sectional, elevational views illustrating three successive steps in the production of a device according to the invention; and Figures 4 and 5 are perspective views of two devices representing two different embodiments of the instant invention.

Similar reference characters are applied to similar elements throughout the drawing.

A typical device according to the invention may be made by first surface alloying a pair of electrodes to a wafer of n-type germanium 2 as shown in Figures 1 and 2. The wafer is preferably cut from a single crystal of n-type germanium having a resistivity of about 0.1 to 1 ohm cm. and may be about 0.1" x .08" x .008" thick. It is initially etched by any known means such as by immersion in a solution of hydrofluoric and nitric acids to reduce its thickness to about .003" and to expose a fresh, clean, crystallographically undisturbed surface. Two pellets 4 and 6 of a material capable of imparting n-type conductivity to germanium when diffused therein are placed in alignment upon opposite surfaces 8 and 10 of the wafer. The pellets may conveniently be composed of an alloy of about 90% lead and 10% antimony. The ensemble is heated in a non-oxidizing atmosphere such as hydrogen or argon at about 700° C. for about 10 minutes to alloy the pellets into the wafer surfaces, to form them into electrodes 4' and 6', respectively, and to produce the n+n barriers 12 and 14 within the wafer.

A 0.1% by weight aqueous copper nitrate solution is then contacted to the exposed surfaces of the wafer to cause copper ions to be adsorbed by the surface. The copper nitrate solution may be applied by immersing the wafer into a relatively large quantity of the solution or, alternatively, the solution may be brushed or sprayed upon the wafer. Preferably, but not necessarily, the alloyed electrodes are masked by a wax or lacquer before the wafer is exposed to the copper nitrate solution. The masking minimizes adsorption of the copper upon the electrodes and minimizes any effect such copper may have when diffused into the electrodes. The solution is maintained in contact with the wafer for about one minute. The wafer is then heated at about 700° C. for about 10 seconds in a non-oxidizing atmosphere to cause the copper ions to diffuse through the surface into the bulk of the wafer. The copper ions convert the bulk of the wafer from n-type to p-type conductivity but do not diffuse completely into the region between the alloyed electrodes. At least a portion of the region of the wafer between the electrodes remains free of the copper and is not converted to p-type conductivity. There is thus created a p–n rectifying barrier 16 between the major portion of the crystal and a portion of the crystal located directly between the electrodes. Electrical leads 18, 20 and 22 may be attached by any known means to the electrodes and the p-type portion of the wafer, respectively. The completed device is shown in Figure 4 and may be conveniently utilized as a unipolar transistor. In a typical circuit application a varying electric signal potential applied across the p–n rectifying barrier 16 is utilized to control the electrical resistance between the alloyed electrodes.

The device, as shown in Figures 3 and 4, comprises a base wafer 2 of semiconductive germanium having a centrally disposed region of n-type semiconductivity. Surface alloyed electrodes 4' and 6' are disposed upon opposite surfaces of the wafer in contact with the n-type region. Each of the alloyed electrodes comprises a mass of electrode material 24 and a recrystallized region 26 which is composed of germanium including relatively large proportions of dissolved electrode material. The recrystallized region is of the same conductivity type as the central region of the wafer, namely, n-type, but because of the relatively large quantities of dissolved electrode material the recrystallized regions have a much higher electrical conductivity and are, therefore, labelled n+. Electrical barriers 12 and 14 are disposed between the recrystallized regions and the central region of the wafer. When the device is incorporated in a circuit, electric current is carried from one electrode to the other primarily by means of majority charge carriers, in this case, electrons, and the rectifying nature of the barriers between the electrodes and the wafer is relatively unimportant. The n+-n barriers are provided to minimize the injection of minority charge carriers into the base and thereby to minimize undesirable interaction between the electrodes and the control barrier. The major portion of the wafer, that is, all the bulk of the wafer surrounding the electrodes and the central n-type semiconductive region is of p-type conductivity and is electrically separated from the central region by a p-n rectifying barrier 16.

During the diffusion process which converts the major portion of the wafer from n-type to p-type conductivity the copper ions diffuse from the surface of the wafer into the bulk thereof and penetrate also into the region of the wafer disposed between the electrodes. The extent of this latter penetration determines the effective diameter of the central, n-type semiconductive region which is a critical dimension in the unipolar transistor. The extent of the penetration of the copper into the central portion of the wafer may be controlled by varying the time and the temperature of the heating for diffusion. The amount of copper initially deposited upon the surface of the wafer also affects the diffusion. It is preferred, however, to control the diffusion by means of temperature and time of heating variations only and to utilize only relatively small quantities of copper. If relatively large quantities of copper are placed on the surface secondary complications are apt to occur such as solution of germanium into the copper and contamination of the alloyed electrodes by the copper. By suitable control of the diffusion the diameter of the central region may be controlled to any desired dimension such as, for example, about 10$\mu$. In operation, the rectifying barrier between the p-type and the n-type regions of the wafer is biased by the application of a signal voltage. The signal voltage causes the depletion layer associated with the barrier to expand and to contract. When the depletion layer is expanded it extends into the central region and reduces the number of charge carriers available for the transport of electric current, thus effectively increasing the resistance of the region.

While in Figure 3 a major portion of the wafer has been shown as of p-type conductivity and the central portion disposed between the electrodes as of n-type conductivity, in accordance with this invention it is only necessary that these two regions have mutually different conductivity characteristics. Thus the diffusion of the copper may be controlled so that the central region, as illustrated in Figure 3, may have, for example, a p-type conductivity. Thus while the base region will be of the same conductivity type, the central portion of the base region disposed between the electrodes will have a different conductivity value from the other regions of the base.

One important advantage provided by the instant invention in unipolar devices is the relatively close spacing between the signal electrodes and the control barrier, which enhances the operation of the devices at high frequencies. Another advantage is the increased sensitivity provided by the controllably small diameter of the signal current channel as defined by the control barrier. A further advantage is the relatively small area of the control barrier which provides a corresponding, small input capacitance and thus improves the high frequency response of the devices.

A tetrode type transistor device as shown in Figure 5 may be made utilizing manipulative steps generally similar to those heretofore described. The conductivity types of the alloyed electrodes and of the converted regions, however, are reversed. For example, p-type impurity electrodes may be alloyed on opposite surfaces of an n-type semiconductor wafer to form two opposite p-n rectifying barriers within the wafer similar to those of an alloy junction triode transistor. The regions of the wafer surrounding the electrodes are then converted to a higher conductivity value, i. e., they are changed from n-type to n+ by diffusing an n-type impurity material into the wafer. A satisfactory n-type material which diffuses relatively rapidly into germanium is lithium which maybe deposited upon the germanium surface by adsorption from an electrolytic solution or by evaporation or electrodeposition. The wafer is then heated to diffuse the lithium into the bulk of the wafer and to form an n+n barrier between the bulk of the wafer surrounding the electrodes and the current path region of the wafer disposed between the alloyed electrodes. Lateral portions of the wafer are then cut away as by abrasive blasting, grinding or etching to divide the bulk of the wafer into two separate regions 34 and 36 connected together by the current path region 38. An electric field may be applied in a direction transverse to the current travel path between the alloyed electrodes by applying a potential between the two separated exterior portions 34 and 36 of the wafer. This control field reduces the effective volume of the current path, or base region and serves to reduce the effective base resistance of the device also to increase its high frequency response.

It will, of course, be appreciated that devices other than those specifically described herein may also be made within the scope of the instant invention. In particular, the conductivity types of the various elements and regions of the devices may be reversed by suitable selection of materials. For example, in making a unipolar device utilizing a base of p-type semiconductive germanium the surface alloyed electrodes should be made of a p-type impurity such as aluminum, gallium or indium, and the conversion of the exterior portions of the wafer from p-type to n-type should be accomplished by the diffusion of an n-type impurity such as lithium.

Similarly, for the device illustrated in Figure 5 the base region may be made of a p-type semiconductive material, and copper, for example, may be diffused into the bulk of the wafer to form a p+p barrier between the bulk of the wafer surrounding the electrodes and the current path region of the wafer disposed between the alloyed electrodes.

When the device is heated to diffuse the impurity placed on the surface of the wafer the alloyed electrode material also diffuses into the wafer. For this reason the impurity diffused through the surface should have a relatively high diffusion coefficient compared to the electrode impurity so that a major portion of the wafer may be converted to a conductivity charactertistic determined by the surface impurity, rather than by the electrode impurity. Copper has a relatively high diffusion co-efficient in germanium and is a so-called p-type impurity. Lithium also has a relatively high diffusion coefficient but is n-type. These are the two elements preferred for the diffusion step of the process and the selection of one or the other depends upon whether it is desired to provide n-type or p-type conductivity in the bulk of the wafer. The selection of an electrode material is not critical in the practice of the invention except as to the diffusion characteristic of the conductivity type-determining impurity of the electrode. The electrode material preferably comprises such impurities having relatively small diffusion coefficients.

The size of the current path between the alloyed electrodes may be controlled as heretofore explained by varying the time and the temperature of the diffusion heating. For example, if about $3\times10^{16}$ copper ions per square cm. are deposited upon the surface of an n-type germanium body of about 1 ohm-cm. resistivity and the body is then heated at about 700° C. for about 10 seconds the copper diffusion is sufficient to convert the germanium to p-type conductivity to a depth of about .010″. If the heating time is increased to about 40 seconds at 700° C. the converted region is extended to about .020″. Diffusion takes place in all directions into the wafer and not only perpendicularly to the surface. The region of converted conductivity extends into the region between the two electrodes and the size of the unconverted, n-type region may, therefore, be controlled by varying the heating.

A further advantage of the instant invention is the reduction of the resistivity of the exterior portions of the wafer when they are converted from one conductivity type to the other by the diffusion of copper or lithium to make a unipolar transistor. The depletion layer associated with the control barrier, therefore, extends farther into the current path region than into the exterior portion of the wafer because the current path region is of higher resistivity than the exterior portions. The efficiency of the devices is thereby improved since a relatively large proportion of the applied signal is utilized to control the current path region and relatively little is wasted by expanding the depletion layer into non-critical regions.

What is claimed is:

1. A field controlled semiconductor device comprising a base of a semiconductive material and a pair of coaxially aligned, barrier-forming electrodes fused to opposite surfaces of said base, said base including at least two regions of mutually different conductivity characteristics having a barrier therebetween, one of said regions being contiguous with and disposed entirely directly between said electrodes.

2. A field controlled semiconductor device comprising a base of a semiconductive material and a pair of coaxially aligned, barrier-forming electrodes fused to opposite surfaces of said base, said base including at least two regions of mutually different conductivity types having a barrier therebetween, one of said regions being contiguous with and disposed entirely directly between said electrodes.

3. A field controlled semiconductor device comprising a base of a semiconductive material and a pair of coaxially aligned, barrier-forming electrodes fused to opposite surfaces of said base, said base including one region of n-type conductivity and a second region of p-type conductivity, said n-type region being contiguous with and disposed entirely directly between said electrodes, said p-type region extending into a portion of said base beyond said electrodes and being electrically separated from said n-type region by a p-n rectifying barrier, said electrodes including an n-type conductivity type-determining impurity and being electrically separated from said n-type region by an n+n barrier.

4. A field controlled semiconductor device comprising a base of a semiconductive material and a pair of coaxially aligned, barrier-forming electrodes fused to opposite surfaces of said base, said base including one region of p-type conductivity and a second region of n-type conductivity, said p-type region being contiguous with and disposed entirely directly between said electrodes, said n-type region extending into a portion of said base beyond said electrodes and being electrically separated from said p-type region by a p-n rectifying barrier, said electrodes including a p-type conductivity type-determining impurity and being electrically separated from said p-type region by a p+p barrier.

5. A field controlled semiconductor device comprising a base of a semiconductive material and a pair of coaxially aligned, rectifying electrodes fused to opposite surfaces of said base, said base including at least two regions of the same conductivity type but of different conductivity values, one of said regions being contiguous with and disposed entirely directly between said electrodes and electrically separated from said electrodes by p-n rectifying barriers.

6. A field controlled semiconductor device comprising a base of an n-type semiconductive material and a pair of coaxially aligned, rectifying electrodes fused to opposite surfaces of said base, said base including a first region of a predetermined conductivity value contiguous with and disposed entirely directly between said electrodes and two regions of higher conductivity than said predetermined value, said two high conductivity regions being isolated from each other and electrically separated from said first region by n+n barriers.

7. A field controlled semiconductor device comprising a base of a p-type semiconductive material and a pair of coaxially aligned, rectifying electrodes fused to opposite surfaces of said base, said base including a first region of a predetermined conductivity value contiguous with and disposed entirely directly between said electrodes and two regions of higher conductivity than said predetermined value, said two high conductivity regions being isolated from each other and electrically separated from said first region by p+p barriers.

8. A method of making a field controlled semiconductor device comprising surface alloying two barrier-forming electrodes upon coaxially aligned, opposite surface portions of a crystalline semiconductive body, said electrodes comprising a material capable of imparting one type of conductivity to said body when dispersed therein, placing a second material upon exposed surface portions of said body, said second material being capable of imparting conductivity of a type opposite to said one type when dispersed in said body, said second material having a diffusion coefficient in said body greater than the diffusion coefficient of said electrode material in said body, and heating said body at a selected temperature and for a period of time sufficient to cause said second material to diffuse throughout a selected region thereof to change the conductivity characteristic of said region thereby to define a current path region in said body, said current path region being of the initial conductivity characteristic of said body and being disposed entirely directly between said alloyed electrodes.

9. A method of making a field controlled semiconductor device comprising surface alloying two barrier-forming electrodes upon coaxially aligned, opposite surface portions of a crystalline semiconductive body of one conductivity type, said electrodes comprising a material capable of imparting conductivity of said one type to said body when dispersed therein, placing a second material upon exposed surface portions of said body, said second material being capable of imparting conductivity of a type opposite to said one type when dispersed in said body, said second material having a diffusion coefficient in said body greater than the diffusion coefficient of said electrode material in said body, and heating said body at a selected temperature and for a period of time sufficient to cause said second material to diffuse throughout a selected region thereof to change the conductivity type of said region thereby to define a current path region in said body, said current path region being of the initial conductivity type of said body and being disposed entirely directly between said alloyed electrodes, said current path region being electrically separated from said selected region by a p-n rectifying barrier.

10. A method of making a field controlled semiconductor device comprising surface alloying two barrier-forming electrodes upon coaxially aligned, opposite surface portions of a crystalline n-type semiconductor body, said electrodes comprising a material capable of imparting n-type conductivity to said body when dispersed therein, placing a second material upon exposed surface portions of said body, said second material being capable of imparting p-type conductivity to said body when dispersed therein and having a diffusion coefficient in said body greater than the diffusion coefficient of said electrode material in said body, and heating said body at a selected temperature and for a period of time sufficient to cause said second material to diffuse throughout a selected region thereof to convert the conductivity type of said region from n to p, thereby to define a current path region in said body electrically separated from said selected region by a p-n rectifying barrier and disposed entirely directly between said alloyed electrodes, said current path region being of n-type conductivity.

11. The method according to claim 10 in which said second material is copper.

12. A method of making a field controlled semiconductor device comprising surface alloying two barrier-forming electrodes upon coaxially aligned, opposite surface portions of a crystalline p-type semiconductor body, said electrodes comprising a material capable of imparting p-type conductivity to said body when dispersed therein, placing a second material upon exposed surface portions of said body, said second material being capable of imparting n-type conductivity to said body when dispersed therein and having a diffusion coefficient in said body greater than the diffusion coefficient of said electrode material in said body, and heating said body at a selected temperature and for a period of time sufficient to cause said second material to diffuse throughout a selected region thereof to convert the conductivity type of said region from p to n, thereby to define a current path region in said body electrically separated from said selected region by a p-n rectifying barrier and disposed entirely directly between said alloyed electrodes, said current path region being of p-type conductivity.

13. The method according to claim 12 in which said second material is lithium.

14. A method of making a field controlled semiconductor device comprising surface alloying two rectifying electrodes upon coaxially aligned, opposite surface portions of a crystalline semiconductive body of one conductivity type, said electrodes comprising a material capable of imparting a conductivity type opposite to said one type to said body when dispersed therein, placing a second material upon exposed surface portions of said body, said second material being capable of imparting said one type of conductivity to said body when dispersed therein and having a diffusion coefficient in said body greater than the diffusion coefficient of said electrode material in said body, and heating said body at a selected temperature and for a period of time sufficient to cause said second material to diffuse throughout a selected region thereof to increase the conductivity of said region thereby to define a current path region in said body, said current path region being of relatively low conductivity with respect to said selected region and being disposed entirely directly between said alloyed electrodes.

15. A method of making a field controlled semiconductor device comprising surface alloying two rectifying electrodes upon coaxially aligned, opposite surface portions of a crystalline n-type semiconductive body, said electrodes comprising a material capable of imparting p-type conductivity to said body when dispersed therein, placing a second material upon exposed surface portions of said body, said second material being capable of imparting n-type conductivity to said body when dispersed therein and having a diffusion coefficient in said body greater than the diffusion coefficient of said electrode material in said body, and heating said body at a selected temperature and for a period of time sufficient to cause said second material to diffuse throughout a selected region thereof to increase the conductivity of said region, thereby to define a current path region in said body electrically separated from said selected region by an n+n barrier, said current path region being disposed entirely directly between said alloyed electrodes.

16. The method according to claim 15 in which said second material is lithium.

17. A method of making a field controlled semiconductor device comprising surface alloying two rectifying electrodes upon coaxially aligned, opposite surface portions of a crystalline p-type semiconductive body, said electrodes comprising a material capable of imparting n-type conductivity to said body when dispersed therein, placing a second material upon exposed surface portions of said body, said second material being capable of imparting p-type conductivity to said body when dispersed therein and having a diffusion coefficient in said body greater than the diffusion coefficient of said electrode material in said body, and heating said body at a selected temperature and for a period of time sufficient to cause said second material to diffuse throughout a selected region thereof to increase the conductivity of said region, thereby to define a current path region in said body electrically separated from said selected region by a p+p barrier, said current path region being disposed entirely directly between said alloyed electrodes.

18. The method according to claim 17 in which said second material is copper.

References Cited in the file of this patent

UNITED STATES PATENTS

| | | |
|---|---|---|
| 2,623,102 | Shockley | Dec. 23, 1952 |
| 2,705,767 | Hall | Apr. 5, 1955 |